United States Patent [19]
Kim

[11] Patent Number: 5,926,427
[45] Date of Patent: Jul. 20, 1999

[54] POWER LINE NOISE PREVENTION CIRCUIT FOR SEMICONDUCTOR MEMORY DEVICE

[75] Inventor: Yong Ki Kim, Kyoungki-do, Rep. of Korea

[73] Assignee: Hyundai Electronics Industries Co., Ltd., Kyoungki-do, Rep. of Korea

[21] Appl. No.: 08/869,005

[22] Filed: Jun. 4, 1997

Related U.S. Application Data

[30] Foreign Application Priority Data

Jun. 29, 1996 [KR] Rep. of Korea ..................... 96-25747

[51] Int. Cl.[6] ................................................ G11C 7/02
[52] U.S. Cl. .................................. 365/206; 365/226
[58] Field of Search ............................. 365/206, 226, 365/189.05, 189.09; 326/27, 83; 327/379

[56] References Cited

U.S. PATENT DOCUMENTS 4,883,978  11/1989  Ohshima et al. .................... 307/443
4,972,100  11/1990  Lim et al. ............................ 307/443
5,341,338   8/1994  Hashiguchi ......................... 365/206
5,619,465   4/1997  Nomura ............................. 365/206

FOREIGN PATENT DOCUMENTS 405054675   3/1993  Japan ........................... G11C 11/413

Primary Examiner—David C. Nelms
Assistant Examiner—Son Mai
Attorney, Agent, or Firm—Gary M. Nath; Nath & Associates

[57] ABSTRACT

A power line noise prevention circuit for a semiconductor memory device which can suppress noises on supply and ground voltage lines with no conventional degradation in operation speed when internal circuits consuming a large current amount are sequentially operated. When a plurality of data output buffers output high data at the same time, the power line noise prevention circuit applies a high voltage to the supply voltage line for the operation time to prevent a supply voltage from being reduced in level. To the contrary, when a plurality of data output buffers output low data at the same time, the power line noise prevention circuit applies a substrate voltage to the ground voltage line for the operation time to prevent a ground voltage from being increased in level.

14 Claims, 6 Drawing Sheets

5,926,427

POWER LINE NOISE PREVENTION CIRCUIT FOR SEMICONDUCTOR MEMORY DEVICE

BACKGROUND OF THE INVENTION

1. Field of the Invention

The present invention relates in general to a power line noise prevention circuit for a semiconductor memory device, and more particularly to a power line noise prevention circuit which is capable of suppressing noises on supply and ground voltage lines when internal circuits consuming a large current amount are sequentially operated. The present invention is applicable to a data output buffer of a multi-bit dynamic random access memory for suppressing a data output noise, and other devices composed of semiconductor chips.

2. Description of the Prior Art

In constructing a data output buffer in a semiconductor memory device, a conventional problem is a self-noise which is generated when the data output buffer is operated under the condition that it has a high drive power. Such a noise is prominent in multi-bit memories. For example, wide-bit memories such as X8, X16 and X32 are exposed to the output noise problem.

The external environment of a memory chip may be a module in which several chips are arranged. In this case, the memory chip is connected to a system data bus via a data bus of the module. The data output buffer must have a high drive power to sufficiently drive the external data bus. When the data output buffer is operated, a chip internal drive voltage and a ground voltage may be varied in level due to a severe noise. In the case where many drivers with high drive capability are operated simultaneously and, furthermore, in the case where all of them drive high or low states, the result becomes severer. In other words, the chip internal drive voltage is instantaneously lowered when all of the data output buffers output high values at the same time, and the ground voltage is instantaneously raised when all of the data output buffers output low values simultaneously.

In the semiconductor chip, generally, a large electrostatic capacity is present between the chip internal drive voltage and the ground voltage to protect them from noises. Such an electrostatic capacity is formed using an artificial space in the chip, and called a decoupling capacitor. Particularly in a dynamic random access memory (referred to hereinafter as DRAM), the decoupling capacitor is used to offset a bit line sense amplification noise. However, when the data output buffer is operated, the complementary decoupling effect cannot be obtained because the consumed current flows out of the chip in the case of high data and into the chip in the case of low data. To the contrary, the decoupling capacitor between the chip internal drive voltage and the ground voltage induces a mutual noise due to coupling between an chip external supply voltage and the ground voltage. Further, an inductance component is present on a path between the chip external supply voltage and the ground voltage. Such an inductance component induces a ringing phenomenon, thereby causing the supply and ground voltage levels to represent a sinusoidal wave. In other words, in the case of outputting high data, the supply voltage is lowered and then coupled to the ground voltage, resulting in a reduction in the ground voltage level. Also, in the case of outputting low data, the ground voltage is raised and then coupled to the supply voltage, resulting in an increase in the supply voltage level. Because such an operation is instantaneously performed, it is directly connected to the ringing phenomenon, which will be an obstacle to a data read operation. The ringing phenomenon is unavoidable unless ideal infinite power is supplied into the chip. Also, the ringing phenomenon becomes severer as an inductance on a power supply pin becomes higher.

Particularly in the DRAM, a VOL value often becomes an issue because it is relatively lower than a VOH value. For example, in the case where only one of all outputs of a multi-bit memory device has a low value, the supply voltage in the chip is instantaneously lowered and then coupled to the ground voltage, resulting in an instantaneous reduction in the ground voltage level. The resultant ringing phenomenon increases the ground voltage level to the VOL value or more, thereby causing the system bus to misrecognize the data output value as high. As a result, the device does not satisfy a given access time or it suffers a loss for a certain time period.

A conventional method for solving the above obstacle is to decrease the drive speed to reduce the noise. The decreased drive speed is obtained by reducing a size of the driver, making a fan-out small at a stage just before the driver, or attaching a resistance component to a ground voltage source of the driver for the prevention of ground bounce. However, the above-mentioned conventional method is not the fundamental countermeasure in that it degrades an access speed having a direct connection with the memory performance.

SUMMARY OF THE INVENTION

Therefore, the present invention has been made in view of the above problems, and it is an object of the present invention to provide a power line noise prevention circuit for a semiconductor memory device which is capable of suppressing noises on supply and ground voltage lines with no effect on a drive speed when internal circuits consuming a large current amount are sequentially operated.

In accordance with one aspect of the present invention, there is provided a power line noise prevention circuit for a semiconductor memory device, comprising high voltage generation means for generating a high voltage to make a word line active; pre-high voltage generation means for generating a pre-high voltage to replenish a reduced amount of a supply voltage; first switching means for transferring the high voltage from the high voltage generation means to a pre-high voltage output terminal of the pre-high voltage generation means when a row address strobe precharge signal is made active; at least one second switching means connected between the pre-high voltage output terminal of the pre-high voltage generation means and a supply voltage line; power stabilizing pulse generation means for controlling the second switching means when a row address strobe signal is made active; and decoupling electrostatic capacitor means for reducing noises on internal circuits using a coupling effect between the supply voltage and a ground voltage.

In accordance with another aspect of the present invention, there is provided a power line noise prevention circuit for a semiconductor memory device, comprising substrate voltage generation means for generating a substrate voltage, the substrate voltage having a negative value to be used as a bulk bias voltage of an NMOS transistor; low voltage generation means for generating a power stabilizing low voltage to absorb an increased amount of a ground voltage; first switching means for transferring the substrate voltage from the substrate voltage generation means to a low voltage output terminal of the low voltage generation means when a row address strobe precharge signal is made active; at least one second switching means connected between the low voltage output terminal of the low voltage generation means and a ground voltage line; power stabilizing pulse generation means for controlling the second switching means when a row address strobe signal is made active; and decoupling electrostatic capacitor means for reducing noises on internal circuits using a coupling effect between a supply voltage and the ground voltage.

In accordance with still another aspect of the present invention, there is provided a power line noise prevention circuit for a semiconductor memory device, comprising high voltage generation means for generating a high voltage to make a word line active; pre-high voltage generation means for generating a pre-high voltage to replenish a reduced amount of a supply voltage; first switching means for transferring the high voltage from the high voltage generation means to a pre-high voltage output terminal of the pre-high voltage generation means when a row address strobe precharge signal is made active; at least one second switching means connected between the pre-high voltage output terminal of the pre-high voltage generation means and a supply voltage line; decoupling electrostatic capacitor means for reducing noises on internal circuits using a coupling effect between the supply voltage and a ground voltage; substrate voltage generation means for generating a substrate voltage, the substrate voltage having a negative value to be used as a bulk bias voltage of an NMOS transistor; low voltage generation means for generating a power stabilizing low voltage to absorb an increased amount of the ground voltage; third switching means for transferring the substrate voltage from the substrate voltage generation means to a low voltage output terminal of the low voltage generation means when a row address strobe precharge signal is made active; at least one fourth switching means connected between the low voltage output terminal of the low voltage generation means and a ground voltage line; and power stabilizing pulse generation means for controlling the second and fourth switching means when a row address strobe signal is made active.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
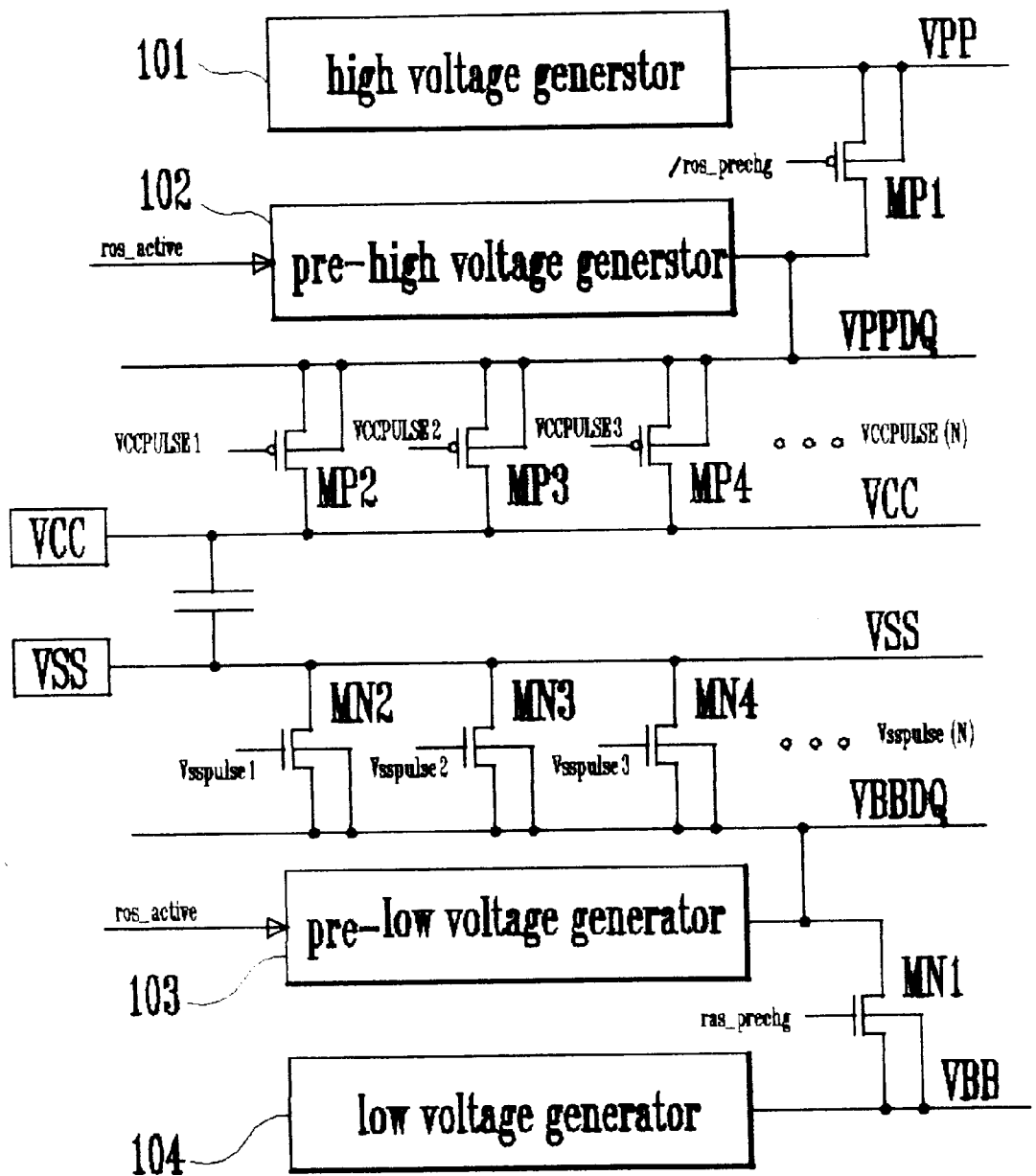
FIG. 1 is a schematic diagram illustrating the construction of a power line noise prevention circuit for a semiconductor memory device in accordance with the present invention.

FIG. 1 is a schematic diagram illustrating the construction of a power line noise prevention circuit for a semiconductor memory device in accordance with the present invention. As shown in this drawing, the power line noise prevention circuit comprises a high voltage generator 101, a pre-high voltage generator 102, a pre-low voltage generator 103 and a low voltage generator 104.

The high voltage generator 101 is adapted to generate a high voltage Vpp which is generally used to make a word line in a DRAM active. The pre-high voltage generator 102 is adapted to generate a pre-high voltage Vppdq for replenishing a reduced amount of a supply voltage Vcc. To this end, the pre-high voltage generator 102 has a separate electrostatic capacity and a finite supply source. The finite supply source may be a high voltage pump of any type. The pre-high voltage generator 102 is a separate pump circuit which is electrically isolated from the high voltage Vpp used to make the word line in the DRAM active. In the pre-high voltage generator 102, the output voltage level is freely determined according to the electrostatic capacity, and the pump is operated only for a data read interval. As a result, a control signal is provided in the pre-high voltage generator 102 to operate the pre-high voltage generator 102 only in a read operation under the condition that a row address strobe signal RAS is made active. There is no necessity for driving the pre-high voltage generator 102 in a row address strobe standby mode. In this case, the high voltage Vpp from the high voltage generator 101 is applied to a pre-high voltage output terminal of the pre-high voltage generator 102 to be used as the pre-high voltage Vppdq.

The low voltage generator 104 is adapted to generate a low voltage (substrate voltage) vbb which has a negative value to be generally used as a bulk bias voltage of an NMOS transistor in the DRAM. The pre-low voltage generator 103 is adapted to generate a pre-low voltage Vbbdq for attenuating an increased amount of a ground voltage Vss. To this end, the pre-low voltage generator 103 has a separate electrostatic capacity and a finite supply source. The finite supply source may be a low voltage pump of any type. The pre-low voltage generator 104 is a separate pump circuit which is electrically isolated from the low voltage Vbb used as the bulk bias voltage of the NMOS transistor in the DRAM. In the pre-low voltage generator 104, the output voltage level is freely determined according to the electrostatic capacity, and the pump is operated only for the data read interval. As a result, a control signal is provided in the pre-low voltage generator 104 to operate the pre-low voltage generator 104 only in the read operation under the condition that the row address strobe signal RAS is made active. There is no necessity for driving the pre-low voltage generator 104 in the row address strobe standby mode. In this case, the low voltage Vbb from the low voltage generator 104 is applied to a pre-low voltage output terminal of the pre-low voltage generator 103 to be used as the pre-low voltage Vbbdq.

The operation of the power line noise prevention circuit with the above-mentioned construction in accordance with the present invention will hereinafter be described in detail.

As mentioned above, the high voltage generator 101 generates the high voltage Vpp which is generally used to make the word line in the DRAM active. The pre-high voltage generator 102 generates a power stabilizing high voltage, or the pre-high voltage Vppdq, for replenishing the amount when the supply voltage Vcc is reduced in level. A PMOS transistor MP1 is connected between a high voltage output terminal of the high voltage generator 101 and the pre-high voltage output terminal of the pre-high voltage generator 102 to perform a clamp function for maintaining the pre-high voltage Vppdq constantly in level when the memory device is at the standby mode, namely, when the row address strobe signal RAS is not made active. In other words, when the row address strobe signal RAS is not made active, the PMOS transistor MP1 transfers the high voltage Vpp from the high voltage generator 101 to the pre-high voltage output terminal of the pre-high voltage generator 102 so that the high voltage Vpp can be used as the pre-high voltage Vppdq. The PMOS transistor MP1 receives an inverted one of a row address strobe precharge signal ras_prechg at its gate. When the row address strobe signal RAS is made active, the inverted row address strobe precharge signal ras_prechg is changed from low to high in logic to release the clamp function. The reason is that the pre-high voltage Vppdq may become instable due to a power stabilizing operation of the present invention, so that it may have an effect on the high voltage Vpp.

The supply voltage Vcc is a drive voltage which is used in the memory device composed of the semiconductor chip, and it is generally supplied from the outside. In the memory device, the supply voltage Vcc is not directly tracked but exposed to a noise due to resistance and inductance components.

A plurality of PMOS transistors MP2, MP3, MP4, . . . are connected in parallel between the pre-high voltage output terminal of the pre-high voltage generator 102 and a supply voltage line to transfer the pre-high voltage Vppdq to the supply voltage line when the supply voltage Vcc is reduced in level due to a noise. The PMOS transistors are all operated when the noise is severest. Pulses Vccpulse are applied respectively to gates of the PMOS transistors to control them. The pulses Vccpulse may partially or all be made active according to the noise level, and the number of the active pulses is determined by a power stabilizing pulse generator 112 which will be mentioned later in detail with reference to FIGS. 4 to 6.

A large electrostatic capacity is present between the supply voltage Vcc and the ground voltage Vss. Such an electrostatic capacity is a decoupling capacitor which reduces noises on general circuits using a coupling effect between the supply voltage Vcc and the ground voltage Vss. Particularly in the DRAM, the decoupling capacitor is used to offset a bit line sense amplification noise. However, the decoupling capacitor may exert the opposite effect, or a noise feedback effect, in the data output buffer.

The low voltage generator 104 generates the low voltage (substrate voltage) Vbb which has the negative value to be generally used as the bulk bias voltage of the NMOS transistor in the DRAM. The pre-low voltage generator 103 generates a power stabilizing low voltage, or the pre-low voltage Vbbdq, for absorbing charge when the ground voltage Vss is increased in level due to a severe noise. An NMOS transistor MN1 is connected between a low voltage output terminal of the low voltage generator 104 and the pre-low voltage output terminal of the pre-low voltage generator 103 to perform a clamp function for maintaining the pre-low voltage Vbbdq constantly in level when the memory device is at the standby mode, namely, when the row address strobe signal RAS is not made active. In other words, when the row address strobe signal RAS is not made active, the NMOS transistor MN1 transfers the low voltage Vbb from the low voltage generator 104 to the pre-low voltage output terminal of the pre-low voltage generator 103 so that the low voltage Vbb can be used as the pre-low voltage Vbbdq. The NMOS transistor MN1 receives the row address strobe precharge signal ras_prechg at its gate. When the row address strobe signal RAS is made active, the row address strobe precharge signal ras_prechg is changed from high to low in logic to release the clamp function. The reason is that the pre-low voltage Vbbdq may become instable due to the power stabilizing operation of the present invention, so that it may have an effect on the low voltage Vbb.

Noticeably, the PMOS transistor MP1 has its bulk connected to the highest voltage, and the NMOS transistor MN1 has its bulk connected to the lowest voltage.

A plurality of NMOS transistors MN2, MN3, MN4, . . . are connected in parallel between the pre-low voltage output terminal of the pre-low voltage generator 103 and a ground voltage line to transfer the pre-low voltage Vbbdq to the ground voltage line when the ground voltage Vss is increased in level due to a noise. The NMOS transistors are all operated when the noise is severest. Pulses Vsspulse are applied respectively to gates of the NMOS transistors to control them. The pulses Vsspulse may partially or all be made active according to the noise level, and the number of the active pulses is determined by the power stabilizing pulse generator 112.

Figure 2A:
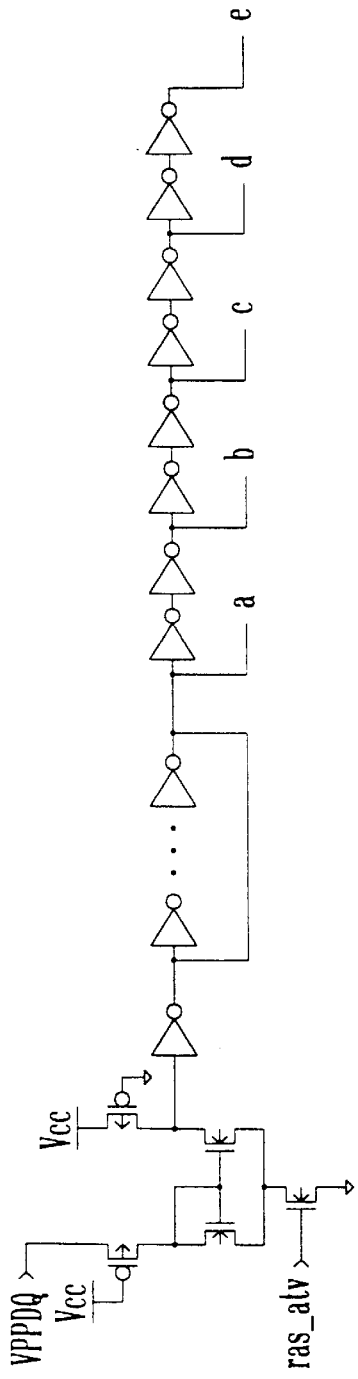
FIG. 2A is a detailed circuit diagram illustrating an embodiment of a pre-high voltage generator in FIG. 1 in accordance with the present invention.
Figure 2B:
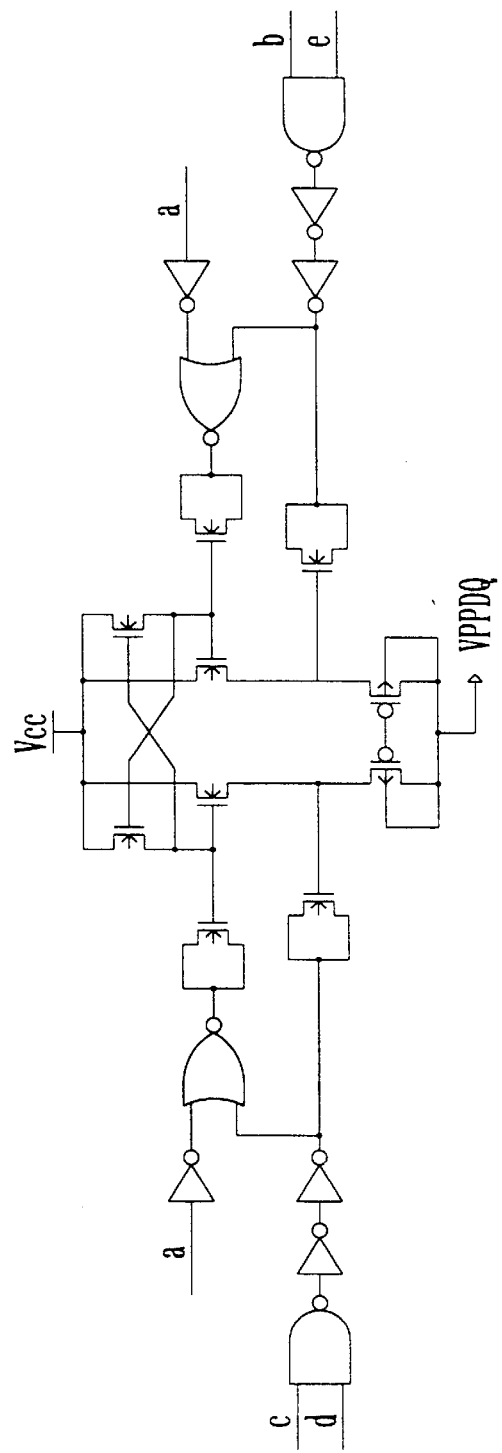
FIG. 2B is a detailed circuit diagram illustrating an alternative embodiment of the pre-high voltage generator in FIG. 1 in accordance with the present invention.

FIG. 2A is a detailed circuit diagram illustrating an embodiment of the pre-high voltage generator 102 in FIG. 1 in accordance with the present invention and FIG. 2B is a detailed circuit diagram illustrating an alternative embodiment of the pre-high voltage generator 102 in FIG. 1 in accordance with the present invention.

In FIG. 2A, in a row address strobe active interval ras_atv, the pre-high voltage Vppdq and the supply voltage Vcc are compared and amplified, and the resultant voltage is then outputted as the pre-high voltage Vppdq. In FIG. 2B, charge is pumped in response to pulse signals a–e to generate the pre-high voltage Vppdq. The pre-high voltage generator 102 is well known in the art and a detailed description thereof will thus be omitted.

Figure 3A:
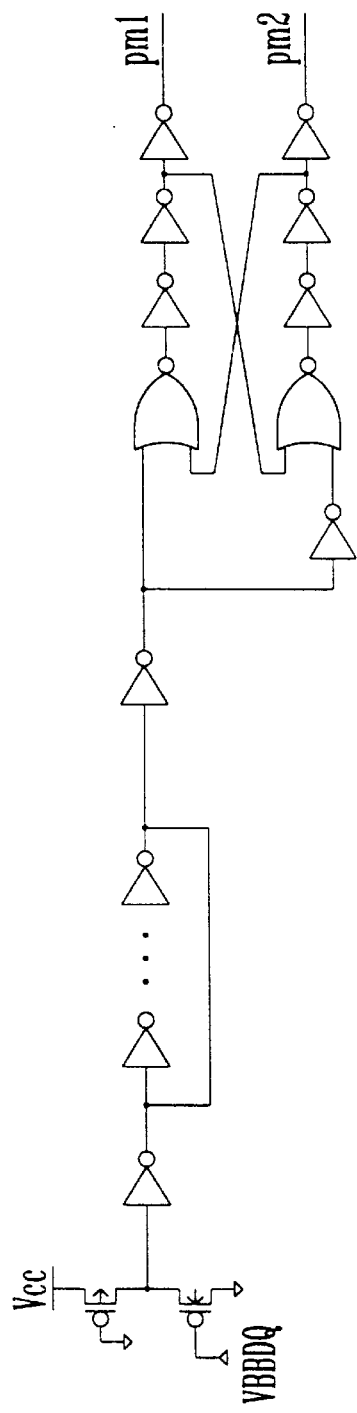
FIG. 3A is a detailed circuit diagram illustrating an embodiment of a pre-low voltage generator in FIG. 1 in accordance with the present invention.
Figure 3B:
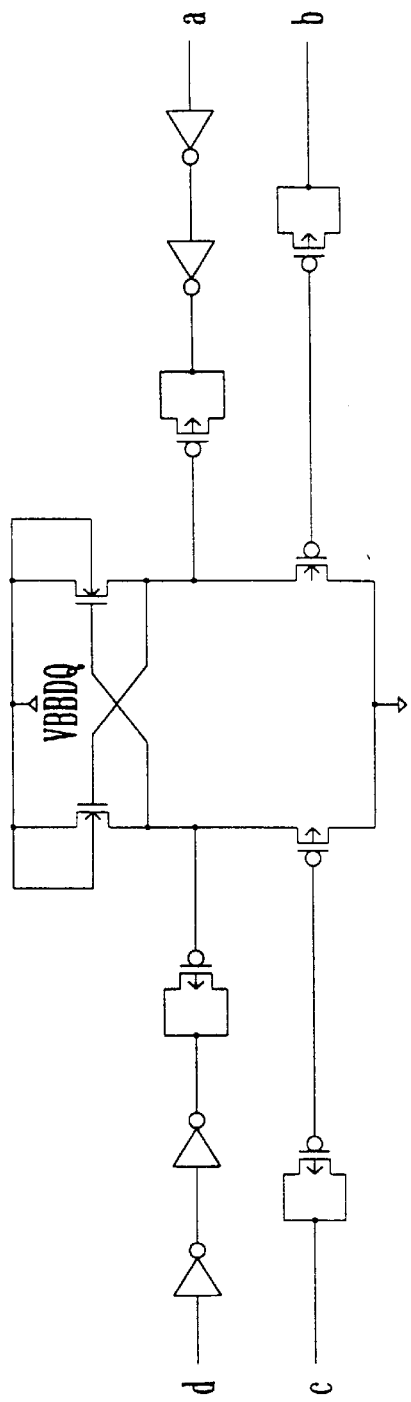
FIG. 3B is a detailed circuit diagram illustrating an alternative embodiment of the pre-low voltage generator in FIG. 1 in accordance with the present invention.

FIG. 3A is a detailed circuit diagram illustrating an embodiment of the pre-low voltage generator 103 in FIG. 1 in accordance with the present invention and FIG. 3B is a detailed circuit diagram illustrating an alternative embodiment of the pre-low voltage generator 103 in FIG. 1 in accordance with the present invention.

In FIG. 3A, in the row address strobe active interval ras_atv, the pre-low voltage Vbbdq and the ground voltage Vss are compared and amplified, and the resultant voltage is then outputted as the pre-low voltage Vbbdq. In FIG. 3B, charge is pumped in response to pulse signals a–d to generate the pre-low voltage Vbbdq. The pre-low voltage generator 103 is well known in the art and a detailed description thereof will thus be omitted.

Figure 4:
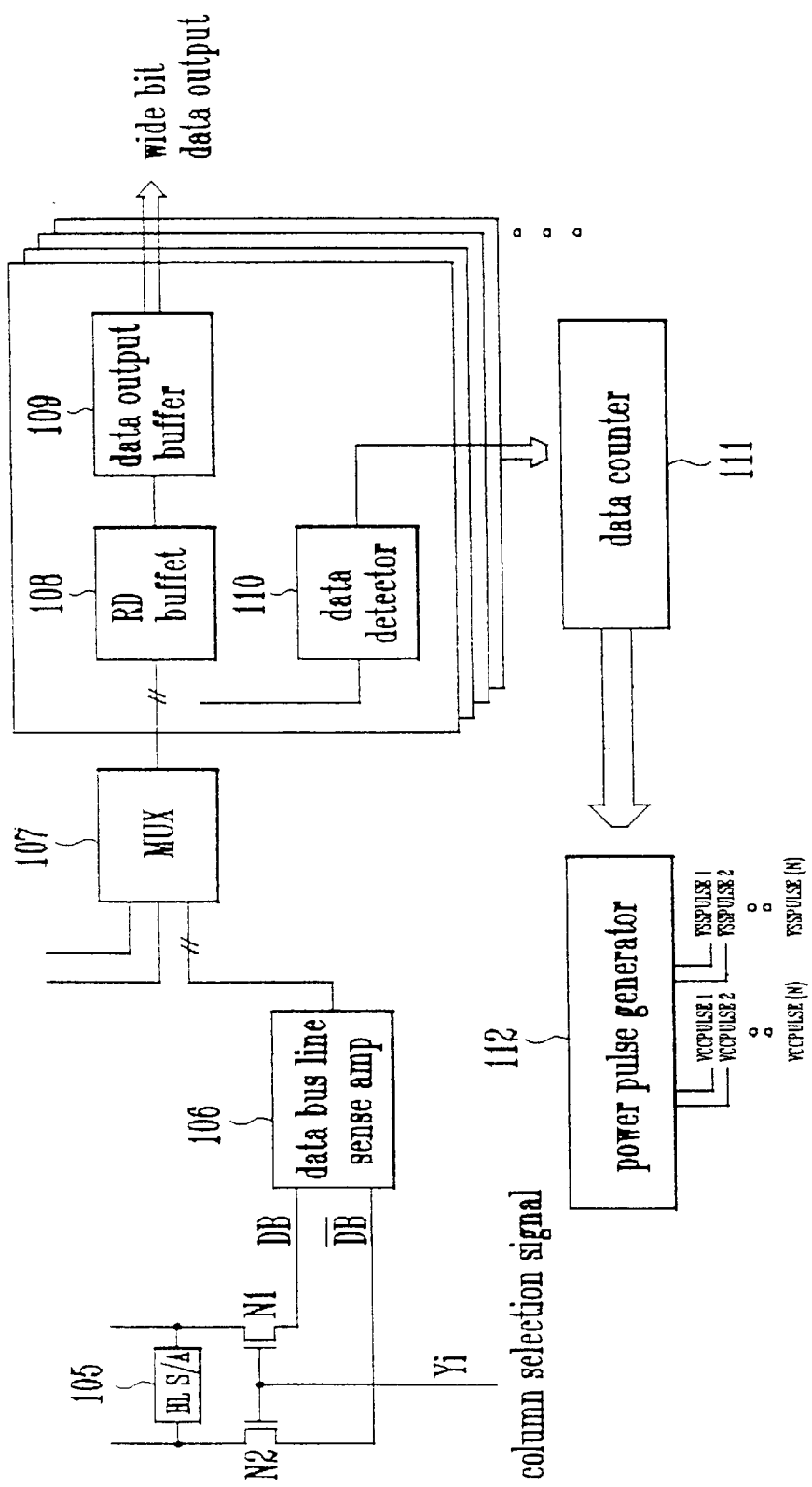
FIG. 4 is a detailed block diagram illustrating an embodiment of a power stabilizing pulse generator which generates control signals in FIG. 1 and the peripheral circuits in accordance with the present invention.

FIG. 4 is a detailed block diagram illustrating an embodiment of the power stabilizing pulse generator 112 which generates the control signals Vccpulse and Vsspulse in FIG. 1 and the peripheral circuits in accordance with the present invention. In this drawing, the reference numeral 105 designates a bit line sense amplifier, 106 designates a data bus line sense amplifier, 107 designates a multiplexer, 108 designates an RD buffer, 109 designates a data output buffer, 110 designates a data detector and 111 designates a data counter.

The data detector 110 is adapted to previously detect whether the output data bit value from the data output buffer 109 is high or low, to enable the power stabilizing operation. To this end, the data detector 110 directly utilizes the input data to the data output buffer 109.

The general read operation of a semiconductor memory device, more particularly DRAM, will hereinafter be mentioned briefly.

First, if a selected word line is made active, data stored in the corresponding cells are transferred to true and complementary bit lines and then increased in level due to charge sharing of the true and complementary bit lines. The bit line sense amplifier 105 is operated to amplify the data on the true and complementary bit lines to the supply and ground voltage levels Vcc and Vss, respectively. Then, if a column selection signal Yi is made active, the amplified data on the true and complementary bit lines are transferred to true and complementary data bus lines, respectively. The data on the true and complementary data bus lines are again amplified to sufficient levels by the data bus line sense amplifier 106. The data amplified by the data bus line sense amplifier 106 are multiplexed by the multiplexer 107 together with data from other memory blocks or banks, to be selected as the input to the data output buffer 109. As needed, the output data from the multiplexer 107 may be passed through the intermediate buffer and bus before being applied to the data output buffer 109.

The data detector 110 utilizes the earliest data signal from the multiplexer 107. Also, the data detector 110 is disposed on each data bit path and provides its output to the input of the data counter 111. The data counter 111 must perform the following functions according to the output data from the data detectors 110.

First, the data counter 111 must detect the number of high output data and the number of low output data before the data output buffers are operated.

Second, the data counter 111 must detect the larger one of the detected high output data number and the detected low output data number and a difference therebetween.

For example, in the case where the high output data and the low output data are the same in number, both power noises offset each other due to decoupling. In this case, there is no necessity for generating any power pulse. However, some power pulses may be generated for the purpose of replenishing any one of pull-up and pull-down drivers when they are different in capacity. If the output data all have high values, the supply voltage Vcc will be reduced in level. In this case, the pulse signals Vccpulse are all generated, whereas the pulse signals Vsspulse are all not generated. To the contrary, provided that the output data all have low values, the ground voltage Vss will be increased in level. In this case, the pulse signals Vsspulse are all generated, whereas the pulse signals Vccpulse are all not generated.

The power stabilizing pulse generator 112 is adapted to generate the pulse signals Vccpulse and Vsspulse to control the switches MP2, MP3, MP4, . . . connected between the supply voltage line and the pre-high voltage output terminal of the pre-high voltage generator 102 and the switches MN2, MN3, MN4, . . . connected between the ground voltage line and the pre-low voltage output terminal of the pre-low voltage generator 103. In view of timing, it is preferred that the pulse signals Vccpulse and Vsspulse are generated in response to a data output buffer enable signal (for example, DEO). The ultimate operation for power line noise prevention is performed by the Vcc stabilizing signal Vccpulse and the Vss stabilizing signal Vsspulse. Such two types of pulse signals may be subdivided into a plurality of individual signals, respectively.

For example, the Vcc stabilizing signal Vccpulse may be subdivided into Vccpulse1, Vccpulse2, Vccpulse3, . . . ,. Also, the Vss stabilizing signal Vsspulse may be subdivided into Vsspulse1, Vsspulse2, Vsspulse3, . . . Here, as the stabilizing signals become larger in number, the power stabilizing operation is performed more precisely.

Respectively in response to the control signals Vccpulse from the power stabilizing pulse generator 112, the power stabilizing switches MP2, MP3, MP4, . . . transfers the pre-high voltage Vppdq to the supply voltage line while the data output buffer is operated. Also, respectively in response to the control signals Vsspulse from the power stabilizing pulse generator 112, the power stabilizing switches MN2, MN3, MN4, . . . transfers the pre-low voltage Vbbdq to the ground voltage line while the data output buffer is operated. The power stabilizing switches MP2, MP3, MP4, . . . receive the control signals Vccpulse from the power stabilizing pulse generator 112 at their gates, respectively. Also, the power stabilizing switches MN2, MN3, MN4, . . . receive the control signals Vsspulse from the power stabilizing pulse generator 112 at their gates, respectively. As a result, the number of the power stabilizing switches is the same as that of the control signals from the power stabilizing pulse generator 112.

Figure 5:
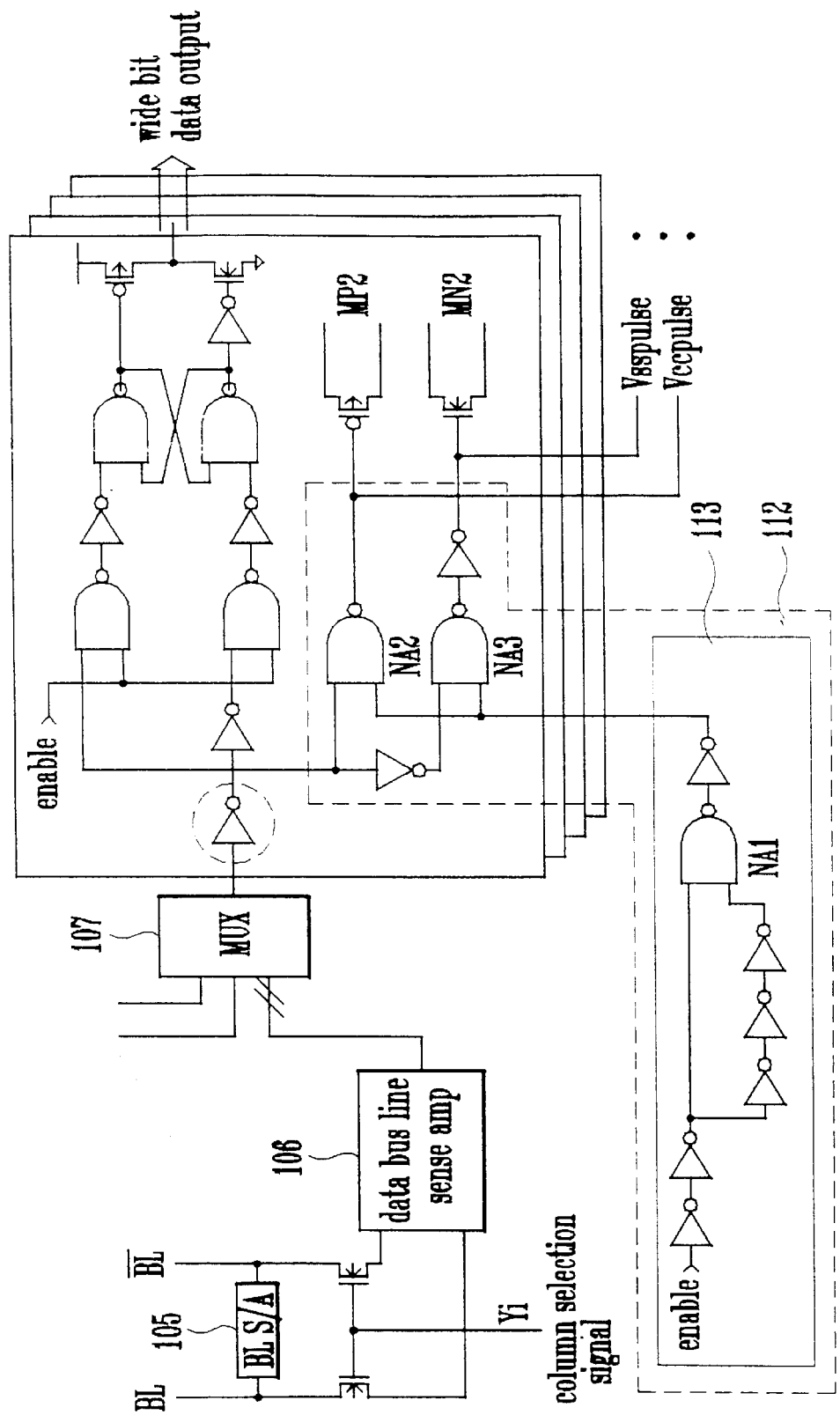
FIG. 5 is a detailed circuit diagram illustrating a different embodiment of the power stabilizing pulse generator which generates the control signals in FIG. 1 and the peripheral circuits in accordance with the present invention.

FIG. 5 is a detailed circuit diagram illustrating a different embodiment of the power stabilizing pulse generator 112 which generates the control signals Vccpulse and Vsspulse in FIG. 1 and the peripheral circuits in accordance with the present invention. As shown in this drawing, the power stabilizing pulse generator 112 comprises an edge signal generator 113 for generating a pulse signal which is enabled for a predetermined time period. The edge signal detector 113 includes a plurality of first inverters for delaying a power stabilizing pulse generator enable signal en, a plurality of second inverters for delaying and inverting an output signal from the last one of the first inverters, a NAND gate NA1 for performing a NAND operation with respect to the output signal from the last one of the first inverters and an output signal from the last one of the second inverters, and a third inverter for inverting an output signal from the NAND gate NA1.

The power stabilizing pulse generator 112 further comprises a NAND gate NA2 for performing a NAND operation with respect to the input data to the data output buffer 109 and an output signal from the edge signal generator 113 and outputting the NANDed result as the control signal Vccpulse, a fourth inverter for inverting the input data to the data output buffer 109, a NAND gate NA3 for performing a NAND operation with respect to an output signal from the fourth inverter and the output signal from the edge signal generator 113, and a fifth inverter for inverting an output signal from the NAND gate NA3 and outputting the inverted signal as the control signal Vsspulse.

With the above construction, the power stabilizing pulse generator 112 generates the control signal Vccpulse if the output data from the data output buffer is high in logic and the control signal Vsspulse if the output data from the data output buffer is low in logic. The pulse signals Vccpulse and Vsspulse from the power stabilizing pulse generator 112 are generated with respect to each data output buffer.

Figure 6:
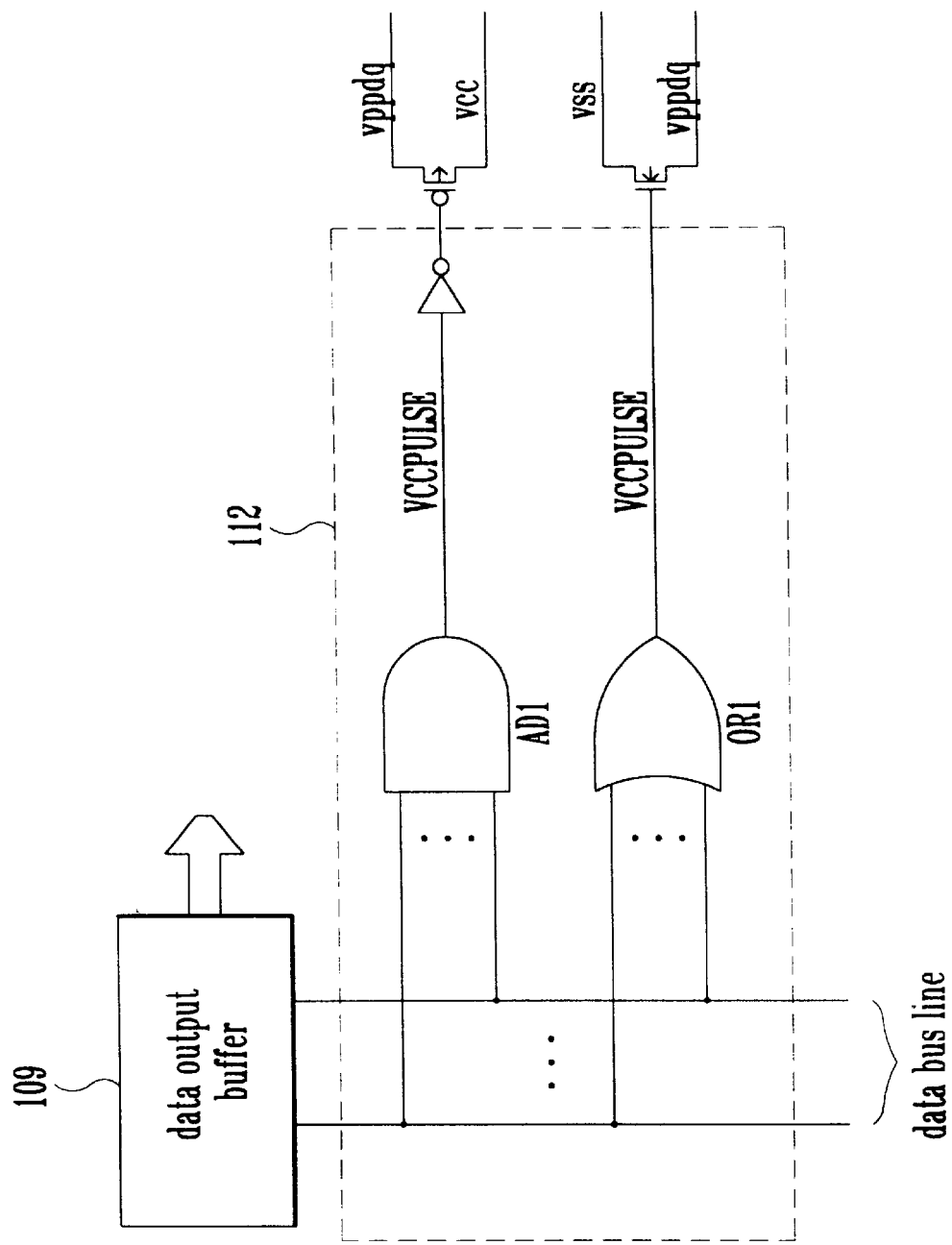
FIG. 6 is a detailed circuit diagram illustrating another embodiment of the power stabilizing pulse generator which generates the control signals in FIG. 1 and the peripheral circuits in accordance with the present invention

FIG. 6 is a detailed circuit diagram illustrating another embodiment of the power stabilizing pulse generator 112 which generates the control signals Vccpulse and Vsspulse in FIG. 1 and the peripheral circuits in accordance with the present invention. As shown in this drawing, the power stabilizing pulse generator 112 comprises an AND gate AD1 for performing an AND operation with respect to data on true and complementary data bus lines, an inverter for inverting an output signal from the AND gate AD1 and outputting the inverted signal as the control signal Vccpulse, and an OR gate OR1 for performing an OR operation with respect to the data on the true and complementary data bus lines and outputting the ORed result as the control signal Vsspulse. With this construction, the power stabilizing pulse generator 112 detects an output data value from the data output buffer and generates the control signal Vccpulse or Vsspulse in accordance with the detected result.

As apparent from the above description, according to the present invention, the power line noise prevention circuit can suppress noises on the supply and ground voltage lines with no conventional degradation in operation speed when internal circuits consuming a large current amount are sequentially operated. In other words, when a plurality of data output buffers output high data at the same time, the power line noise prevention circuit applies the high voltage to the supply voltage line for the operation time to prevent the supply voltage from being reduced in level. To the contrary, when a plurality of data output buffers output low data at the same time, the power line noise prevention circuit applies the negative voltage to the ground voltage line for the operation time to prevent the ground voltage from being increased in level.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A power line noise prevention circuit for a semiconductor memory device, comprising:

high voltage generation means for generating a high voltage to make a word line active;

pre-high voltage generation means for generating a pre-high voltage to replenish a reduced amount of a supply voltage;

first switching means for transferring said high voltage from said high voltage generation means to a pre-high voltage output terminal of said pre-high voltage generation means when a row address strobe precharge signal is made active;

at least one second switching means connected between said pre-high voltage output terminal of said pre-high voltage generation means and a supply voltage line;

power stabilizing pulse generation means for controlling said second switching means when a row address strobe signal is made active; and decoupling electrostatic capacitor means for reducing noises on internal circuits using a coupling effect between said supply voltage and a ground voltage.

2. A power line noise prevention circuit for a semiconductor memory device, as set forth in claim 1, wherein said pre-high voltage from said pre-high voltage generation means is the same in level as said high voltage from said high voltage generation means.

3. A power line noise prevention circuit for a semiconductor memory device, as set forth in claim 1, wherein each of said first and second switching means is a PMOS transistor.

4. A power line noise prevention circuit for a semiconductor memory device, as set forth in claim 1, wherein said power stabilizing pulse generation means makes said second switching means active while or just before said internal circuits are operated.

5. A power line noise prevention circuit for a semiconductor memory device, as set forth in claim 4, wherein said power stabilizing pulse generation means generates at least one pulse signal to control said second switching means, said pulse signal being determined in active number according to the reduced amount of said supply voltage.

6. A power line noise prevention circuit for a semiconductor memory device, comprising:

substrate voltage generation means for generating a substrate voltage, said substrate voltage having a negative value to be used as a bulk bias voltage of an NMOS transistor;

low voltage generation means for generating a power stabilizing low voltage to absorb an increased amount of a ground voltage;

first switching means for transferring said substrate voltage from said substrate voltage generation means to a low voltage output terminal of said low voltage generation means when a row address strobe precharge signal is made active;

at least one second switching means connected between said low voltage output terminal of said low voltage generation means and a ground voltage line;

power stabilizing pulse generation means for controlling said second switching means when a row address strobe signal is made active; and decoupling electrostatic capacitor means for reducing noises on internal circuits using a coupling effect between a supply voltage and said ground voltage.

7. A power line noise prevention circuit for a semiconductor memory device, as set forth in claim 6, wherein said power stabilizing low voltage from said low voltage generation means is the same in level as said substrate voltage from said substrate voltage generation means.

8. A power line noise prevention circuit for a semiconductor memory device, as set forth in claim 6, wherein each of said first and second switching means is an NMOS transistor, said NMOS transistor having its bulk connected to the lowest voltage.

9. A power line noise prevention circuit for a semiconductor memory device, as set forth in claim 6, wherein said power stabilizing pulse generation means makes said second switching means active while or just before said internal circuits are operated.

10. A power line noise prevention circuit for a semiconductor memory device, as set forth in claim 9, wherein said power stabilizing pulse generation means generates at least one pulse signal to control said second switching means, said pulse signal being determined in active number according to the increased amount of said ground voltage.

11. A power line noise prevention circuit for a semiconductor memory device, comprising:

high voltage generation means for generating a high voltage to make a word line active;

pre-high voltage generation means for generating a pre-high voltage to replenish a reduced amount of a supply voltage;

first switching means for transferring said high voltage from said high voltage generation means to a pre-high voltage output terminal of said pre-high voltage generation means when a row address strobe precharge signal is made active;

at least one second switching means connected between said pre-high voltage output terminal of said pre-high voltage generation means and a supply voltage line;

decoupling electrostatic capacitor means for reducing noises on internal circuits using a coupling effect between said supply voltage and a ground voltage;

substrate voltage generation means for generating a substrate voltage, said substrate voltage having a negative value to be used as a bulk bias voltage of an NMOS transistor;

low voltage generation means for generating a power stabilizing low voltage to absorb an increased amount of said ground voltage;

third switching means for transferring said substrate voltage from said substrate voltage generation means to a low voltage output terminal of said low voltage generation means when a row address strobe precharge signal is made active;

at least one fourth switching means connected between said low voltage output terminal of said low voltage generation means and a ground voltage line; and power stabilizing pulse generation means for controlling said second and fourth switching means when a row address strobe signal is made active.

12. A power line noise prevention circuit for a semiconductor memory device, as set forth in claim 11, wherein said power stabilizing pulse generation means turns on said second switching means to prevent said supply voltage from being reduced in level when a plurality of data output buffers output high data at the same time, and said fourth switching means to prevent said ground voltage from being increased in level when said plurality of data output buffers output low data at the same time.

13. A power line noise prevention circuit for a semiconductor memory device, as set forth in claim 11, wherein said power stabilizing pulse generation means includes:

an edge signal detector including a plurality of first inverters for delaying a power stabilizing pulse generator enable signal, a plurality of second inverters for delaying and inverting an output signal from the last one of said first inverters, a first NAND gate for performing a NAND operation with respect to the output signal from the last one of said first inverters and an output signal from the last one of said second inverters, and a third inverter for inverting an output signal from said first NAND gate;

a second NAND gate for performing a NAND operation with respect to input data to a data output buffer and an output signal from said edge signal generator and outputting the NANDed result as a first control signal to control said second switching means;

a fourth inverter for inverting the input data to said data output buffer;

a third NAND gate for performing a NAND operation with respect to an output signal from said fourth inverter and the output signal from said edge signal generator; and a fifth inverter for inverting an output signal from said third NAND gate and outputting the inverted signal as a second control signal to control said fourth switching means.

14. A power line noise prevention circuit for a semiconductor memory device, as set forth in claim 11, wherein said power stabilizing pulse generation means includes:

an AND gate for performing an AND operation with respect to data on true and complementary data bus lines;

an inverter for inverting an output signal from said AND gate and outputting the inverted signal as a first control signal to control said second switching means; and an OR gate for performing an OR operation with respect to the data on said true and complementary data bus lines and outputting the ORed result as a second control signal to control said fourth switching means.

* * * * *